(12) United States Patent
Ishikawa et al.

(10) Patent No.: US 8,674,397 B2
(45) Date of Patent: Mar. 18, 2014

(54) SEALING FILM FORMING METHOD, SEALING FILM FORMING DEVICE, AND LIGHT-EMITTING DEVICE

(71) Applicant: Tokyo Electron Limited, Tokyo (JP)

(72) Inventors: Hiraku Ishikawa, Sendai (JP); Teruyuki Hayashi, Sendai (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/723,452

(22) Filed: Dec. 21, 2012

(65) Prior Publication Data

US 2013/0126939 A1 May 23, 2013

Related U.S. Application Data

(63) Continuation-in-part of application No. PCT/JP2011/063780, filed on Jun. 16, 2011.

(30) Foreign Application Priority Data

Jun. 23, 2010 (JP) ................................. 2010-142929

(51) Int. Cl.
*H01L 33/00* (2010.01)

(52) U.S. Cl.
USPC ............ 257/100; 257/790; 257/E33.056; 257/E33.059; 438/26

(58) Field of Classification Search
USPC ................. 257/100, 790, E33.056, E33.059; 438/26
See application file for complete search history.

(56) References Cited

U.S. PATENT DOCUMENTS 8,188,489 B2 * 5/2012 Lee et al. .................... 257/88

FOREIGN PATENT DOCUMENTS

| JP | 64-041192 | 2/1989 |
|---|---|---|
| JP | 2-277684 | 11/1990 |
| JP | 4-267097 | 9/1992 |
| JP | 10-312883 | 11/1998 |
| JP | 2008-108628 | 5/2008 |
| JP | 2009-509036 | 3/2009 |
| JP | 2009-99417 | 5/2009 |
| KR | 10-2011-0109397 | 10/2011 |
| WO | 2009/028485 | 3/2009 |

OTHER PUBLICATIONS

International Search Report and Written Opinion from International Application No. PCT/JP2011/063780/ mailed Jul. 19, 2011.

* cited by examiner

*Primary Examiner* — Tu-Tu Ho
(74) *Attorney, Agent, or Firm* — Brundidge & Stanger, P.C.

(57) ABSTRACT

A sealing film forming method is capable of forming a sealing film having high moisture permeability resistance in a shorter time and at lower cost. The sealing film forming method for forming a sealing film 13 that seals an EL device 12 includes forming a first inorganic layer 13a on a surface of the EL device 12; forming a hydrocarbon layer 13c on the first inorganic layer 13a; flattening the hydrocarbon layer 13c by softening or melting the hydrocarbon layer 13c; curing the hydrocarbon layer 13c; and forming a second inorganic layer 13e thicker than the first inorganic layer 13a on the hydrocarbon layer 13c after curing the hydrocarbon layer 13c.

8 Claims, 11 Drawing Sheets

SEALING FILM FORMING METHOD, SEALING FILM FORMING DEVICE, AND LIGHT-EMITTING DEVICE

CROSS-REFERENCE TO RELATED APPLICATION

This application is a Continuation-In-Part of International Application No. PCT/JP2011/063780 filed on Jun. 16, 2011, which claims the benefit of Japanese Patent Application No. 2010-142929 filed on Jun. 23, 2010. The entire disclosure of the prior application is incorporated herein by reference in its entirety.

FIELD OF THE INVENTION

The present invention relates to a sealing film forming method for forming a sealing film that seals a light-emitting device, a sealing film forming device, and a light-emitting device on which a sealing film is formed.

BACKGROUND OF THE INVENTION

Recently, an EL device using electroluminescence (EL) has been developed. The EL device consumes lower power compared to a cathode-ray tube. Further, since the EL device is a self-luminescent device, there are some other advantages, for example, a view angle wider than that of liquid crystal display (LCD), so that progress thereof in the future is expected.

However, since the EL device is vulnerable to moisture, light-emitting luminance may be decreased due to moisture permeating through a defective part of the device or a non-emitting area called "dark spot" can be formed. Therefore, a sealing film having moisture permeability resistance is formed on a surface of the EL device. As the sealing film requiring a low-temperature process as performed on the EL device and very high moisture permeability resistance, an inorganic layer such as a silicon nitride layer and an aluminum oxide layer has been used. Further, there is suggested a sealing film having a stacked structure of an inorganic layer and an organic layer such as UV curable resin (for example, Patent Documents 1 to 3).

Patent Document 1: Japanese Patent Laid-open Publication No. H10-312883
Patent Document 2: Japanese Patent Laid-open Publication No. H04-267097
Patent Document 3: Japanese Patent Laid-open Publication No. S64-041192

However, in order to obtain moisture permeability resistance, a sealing film needs to be formed of a thick inorganic layer capable of burying impurity particles adhering to a substrate surface through a low-temperature process. If a sealing film is formed of a thin inorganic layer that cannot bury impurity particles, a defective part can be formed between the impurity particles and the inorganic layer, and moisture may permeate through the defective part. For this reason, it takes several hours to form a thick sealing film. Even if the sealing film is formed of the thick inorganic layer capable of burying impurity particles, there may be some defective parts. By way of example, if an impurity particle has a protruding part along a direction of a substrate surface, there is a part on which an inorganic layer cannot be deposited due to the protruding part, and, thus, a defective part can be formed.

Further, Patent Document 1 describes a method including forming a buffer layer made of photo curable resin on the EL device and curing the buffer layer to further form an inorganic layer on the buffer layer. However, there is a problem in that the EL device is deteriorated by UV rays irradiated when curing the buffer layer.

Furthermore, Patent Document 2 describes a method including forming an inorganic layer on the EL device and forming a photo curable resin layer on the inorganic layer. In order to obtain high moisture permeability resistance, the inorganic layer needs to be thick enough to bury impurity particles adhering to a glass substrate. Therefore, a time required for forming a sealing film cannot be reduced.

Moreover, Patent Document 3 describes a method including forming an inorganic layer, an organic layer, and an inorganic layer in sequence on the EL device. Even if this method for stacking respective layers is used, if impurity particles adhere to a glass substrate, there may be formed a defective part through which moisture permeate. Therefore, if the inorganic layer is not thick enough, high moisture permeability resistance cannot be obtained.

BRIEF SUMMARY OF THE INVENTION

In view of the foregoing, illustrative embodiments provide a sealing film forming method, a sealing film forming device capable of forming a sealing film having high moisture permeability resistance in a shorter time and at lower cost compared to the conventional methods, and a light-emitting device.

In accordance with one aspect of an illustrative embodiment, there is provided a sealing film forming method for forming a sealing film that seals a light-emitting device. The sealing film forming method includes: forming a first inorganic layer on a surface of the light-emitting device; forming a hydrocarbon layer on the first inorganic layer; flattening the hydrocarbon layer by softening or melting the hydrocarbon layer; curing the hydrocarbon layer; and forming a second inorganic layer thicker than the first inorganic layer on the hydrocarbon layer after curing the hydrocarbon layer.

In accordance with another aspect of the illustrative embodiment, there is provided a sealing film forming device for forming a sealing film that seals a light-emitting device. The sealing film forming device includes: a first inorganic layer forming device configured to form a first inorganic layer on a surface of the light-emitting device; a hydrocarbon layer forming device configured to form a hydrocarbon layer on the first inorganic layer; a heating device configured to heat the hydrocarbon layer; an irradiating device configured to irradiate electron beams or ultraviolet rays to the hydrocarbon layer; and a second inorganic layer forming device configured to form a second inorganic layer thicker than the first inorganic layer on the hydrocarbon layer after irradiating the electron beams or the ultraviolet rays to the hydrocarbon layer.

In accordance with still another aspect of the illustrative embodiment, there is provided a light-emitting device sealed by a sealing film. Here, the sealing film includes: a first inorganic layer formed on a surface of the light-emitting device; a hydrocarbon layer, having a reflow shape, formed on the first inorganic layer; and a second inorganic layer formed on the hydrocarbon layer. Further, the second inorganic layer is thicker than the first inorganic layer.

In accordance with the illustrative embodiment, a first inorganic layer is formed on a surface of the light-emitting device. As a result, contamination or a chemical reaction of the light-emitting device, which is generated by an organic component of a hydrocarbon layer, does not occur during a film forming process to be performed later. Since the hydrocarbon layer having a reflow shape is formed on the first inorganic layer, the light-emitting device is coated without defects. Further, since the hydrocarbon layer has a flattened reflow shape, an inorganic layer is formed on the hydrocarbon layer without defects. Furthermore, since the hydrocarbon layer is cured, it is possible to securely prevent formation of defective parts and permeation of moisture caused by re-softening and melting of the hydrocarbon layer. Moreover, since the hydrocarbon layer can be formed to be thick in a shorter time compared to an inorganic layer, a second inorganic layer serving as a moisture permeability-resistant film can be formed to be thin in a shorter time compared to the inorganic layers in accordance with the conventional methods. Besides, even if the second inorganic layer is formed to be thinner compared to the inorganic layers in accordance with the conventional methods, since the hydrocarbon layer having the flattened reflow shape is formed under the second inorganic layer, moisture permeability resistance can be obtained. Further, the second inorganic layer serving as the moisture permeability-resistant film is formed to be relatively thick, whereas the first inorganic layer serving as a protective film during a film forming process is formed to be thin. Therefore, a time required for forming the inorganic layers can be shortened.

Accordingly, it is possible to obtain moisture permeability resistance and also possible to shorten a time required for forming the sealing film, particularly, the inorganic layers.

In accordance with illustrative embodiments, a sealing film having high moisture permeability resistance can be formed in a shorter time and at lower cost compared to the conventional methods.

DETAILED DESCRIPTION OF THE INVENTION

Hereinafter, illustrative embodiments will be explained in detail with reference to the accompanying drawings.

Figure 1A:
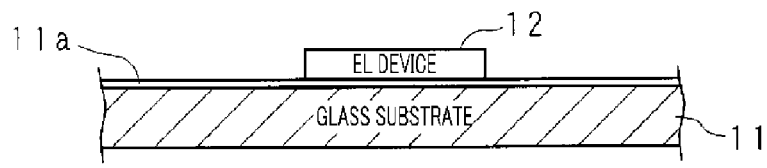
FIG. 1A is an explanatory diagram that conceptually illustrates an example of a sealing film forming method in accordance with an illustrative embodiment.
Figure 1B:
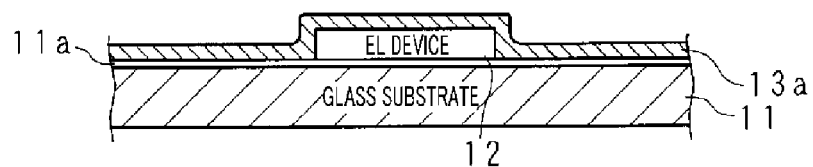
FIG. 1B is an explanatory diagram that conceptually illustrates an example of the sealing film forming method in accordance with the illustrative embodiment.

FIGS. 1A to 1H are explanatory diagrams each conceptually illustrating an example of a sealing film forming method in accordance with an illustrative embodiment. As depicted in FIG. 1A, an EL device 12 is formed on a glass substrate 11 on which an anodic layer 11a such as an ITO (Indium Tin Oxide) film is formed. Then, as depicted in FIG. 1B, a first inorganic layer 13a is formed on a surface of the glass substrate 11 on which the anodic layer 11a is formed and a surface of the EL device 12. The first inorganic layer 13a is formed of, for example, a silicon nitride film by performing a low-temperature plasma CVD (Chemical Vapor Deposition) method. Further, the first inorganic layer 13a may be formed of a silicon oxide film or an aluminum oxide film. The silicon oxide film is formed by performing the plasma CVD method. A thickness of the first inorganic layer 13a is in a range of from about 100 nm to about 1000 nm. Since the first inorganic layer 13a is formed, it is possible to prevent the EL device 12 from being damaged by a film forming process to be performed later. That is, if the EL device 12 is brought into direct contact with a hydrocarbon layer 13c as an organic layer formed by the film forming process to be performed later, contamination or a chemical reaction of the EL device 12 may be generated by an organic component of a sealing film can occur. For this reason, the first inorganic layer 13a is formed on the EL device 12. The silicon nitride film as the first inorganic layer 13a can increase adhesion to a first amorphous carbon layer 13b formed by a following process as a more desirable sealing film forming method, and can also increase adhesion between the silicon nitride film and the hydrocarbon layer 13c with the first amorphous carbon layer 13b therebetween. That is, the adhesion between the silicon nitride film and the first amorphous carbon layer 13b is higher than adhesion between the glass substrate 11 and the first amorphous carbon layer 13b, and adhesion between the hydrocarbon layer 13c formed by the film forming process to be performed later and the first amorphous carbon layer 13b is higher than the adhesion between the silicon nitride film and the hydrocarbon layer 13c. Therefore, the silicon nitride film and the hydrocarbon layer 13c with the first amorphous carbon layer 13b therebetween can be formed closely on the glass substrate 11. Accordingly, it is possible to increase moisture permeability resistance.

Figure 1C:
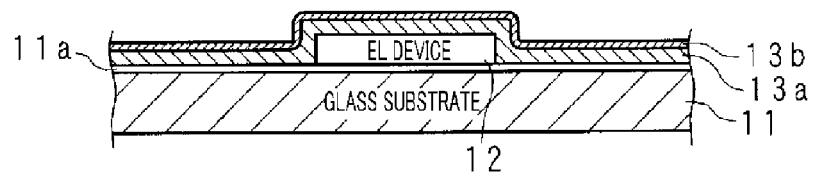
FIG. 1C is an explanatory diagram that conceptually illustrates an example of the sealing film forming method in accordance with the illustrative embodiment.

Further, as depicted in FIG. 1C, the first amorphous carbon layer 13b is formed on the first inorganic layer 13a. The first amorphous carbon layer 13b is formed by performing, for example, the plasma CVD method and has a thickness in a range of from about 100 nm to about 500 nm. Since the first amorphous carbon layer 13b is formed, adhesion between the hydrocarbon layer 13c formed by the following process and the first inorganic layer 13a can be increased. Accordingly, it is possible to further increase moisture permeability resistance.

Figure 1D:
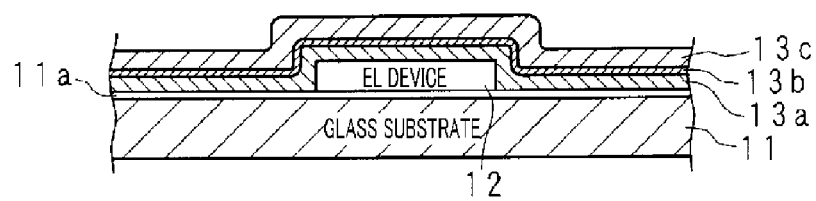
FIG. 1D is an explanatory diagram that conceptually illustrates an example of the sealing film forming method in accordance with the illustrative embodiment.

Then, as depicted in FIG. 1D, the hydrocarbon layer 13c is formed on the first amorphous carbon layer 13b formed on the EL device 12. The hydrocarbon layer 13c is formed by performing, for example, a vacuum deposition method. To be specific, a hydrocarbon material in a solid state at a room temperature is heated to be vaporized, and vapor of the hydrocarbon material is transferred by a carrier gas such as an argon (Ar) gas onto the first amorphous carbon layer 13b on the glass substrate 11. When the vapor of the hydrocarbon material is supplied, the glass substrate 11 is controlled to have a temperature lower than a melting point of the hydrocarbon material. Thus, the vapor of the hydrocarbon material supplied onto the first amorphous carbon layer 13b is condensed to form the hydrocarbon layer 13c. A thickness of the hydrocarbon layer 13c is in a range of, for example, from about 0.5 μm to about 2.0 μm.

The following table shows molecular formulas, molecular weights, and melting points of representative hydrocarbon materials. In order to prevent deterioration of the EL device 12, it is desirable to use a hydrocarbon material having a melting point equal or less than about 100° C. It is more desirable to use a hydrocarbon material having a melting point equal or less than 50° C. It is possible to securely prevent deterioration of the EL device 12.

TABLE 1

| Molecular formula | Molecular weight | Melting point (° C.) |
| --- | --- | --- |
| $C_{20}H_{42}$ | 282 | 36 |
| $C_{21}H_{44}$ | 296 | 42 |
| $C_{22}H_{46}$ | 310 | 46 |
| $C_{23}H_{48}$ | 324 | 47 |
| $C_{24}H_{50}$ | 338 | 51 |
| $C_{25}H_{52}$ | 352 | 54 |
| $C_{28}H_{58}$ | 394 | 62 |
| $C_{30}H_{62}$ | 422 | 66 |
| $C_{40}H_{82}$ | 562 | 82 |
| $C_{50}H_{102}$ | 702 | 94 |
| $C_{60}H_{122}$ | 842 | 98 |

Figure 1E:
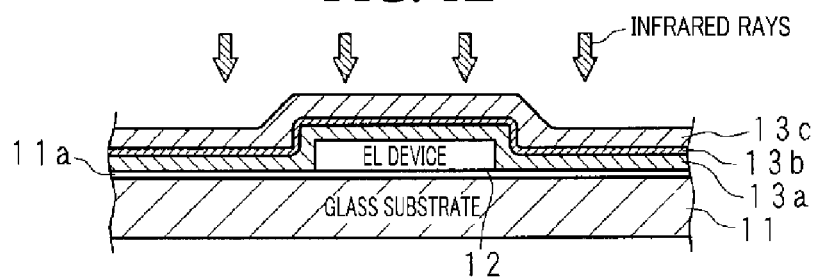
FIG. 1E is an explanatory diagram that conceptually illustrates an example of the sealing film forming method in accordance with the illustrative embodiment.

Thereafter, as depicted in FIG. 1E, the hydrocarbon layer 13c is heated by irradiating infrared rays to soften or melt the hydrocarbon layer 13c. The hydrocarbon layer 13c is flattened by a reflow process. That is, the hydrocarbon layer 13c has a "reflow shape". In FIG. 1E, hatched arrows indicate the infrared rays. A heating temperature of the hydrocarbon layer 13c has a temperature range in which the hydrocarbon layer 13c is softened or melted and the EL device 12 is not deteriorated. By softening or melting the hydrocarbon layer 13c, the flattened film having good coverage can be formed.

Typically, impurity particles adhere to the glass substrate 11. An impurity particle may have a size of about 3 μm. Depending on a shape of the impurity particle, the glass substrate 11 and the impurity particle may not be covered by the hydrocarbon layer 13c, and a defective part may be formed. If there is a defective part, moisture permeability resistance may be decreased and the film forming process to be performed later may be adversely affected. Therefore, by softening or melting the hydrocarbon layer 13c, the hydrocarbon layer 13c can be flattened so that the defective part is buried.

Figure 1F:
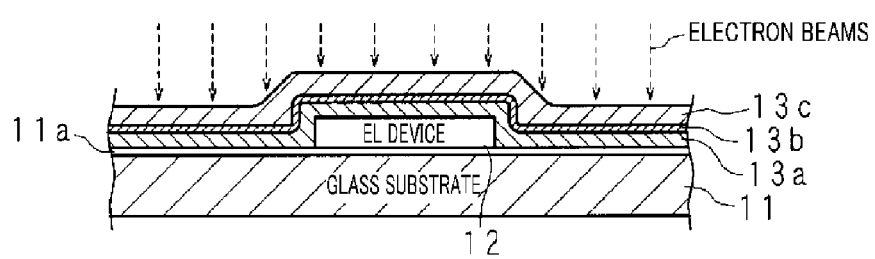
FIG. 1F is an explanatory diagram that conceptually illustrates an example of the sealing film forming method in accordance with the illustrative embodiment.

Subsequently, a temperature of the glass substrate 11 is decreased to a temperature, for example, the room temperature lower than the melting point of the hydrocarbon layer 13c. Then, as depicted in FIG. 1F, electron beams are irradiated and the hydrocarbon layer 13c is cured by a cross-linking reaction of the hydrocarbon material. In FIG. 1F, dotted line arrows indicate the electron beams. By curing the hydrocarbon layer 13c, heat resistance can be increased. Since the heat resistance of the hydrocarbon layer 13c is increased, a reflow shape can be maintained during the following processes. If the hydrocarbon layer 13c is made of UV curable resin, the hydrocarbon layer 13c can be cured by irradiating ultraviolet rays. Since the first inorganic layer 13a is formed under the hydrocarbon layer 13c, the EL device 12 can be protected from the electron beams and ultraviolet rays. Therefore, it is possible to prevent a light-emitting layer of the EL device 12 from being damaged.

Figure 1G:
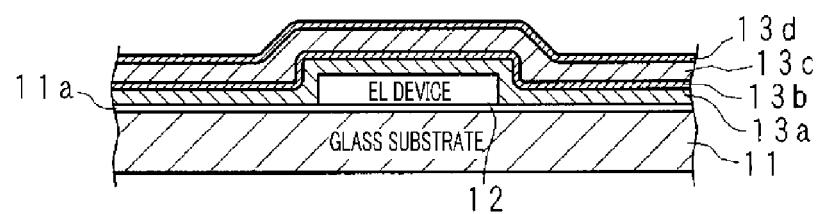
FIG. 1G is an explanatory diagram that conceptually illustrates an example of the sealing film forming method in accordance with the illustrative embodiment.

Then, as a more desirable sealing film forming method, a second amorphous carbon layer 13d is formed on the hydrocarbon layer 13c as depicted in FIG. 1G. A forming method of the second amorphous carbon layer 13d is the same as that of the first amorphous carbon layer 13b.

Figure 1H:
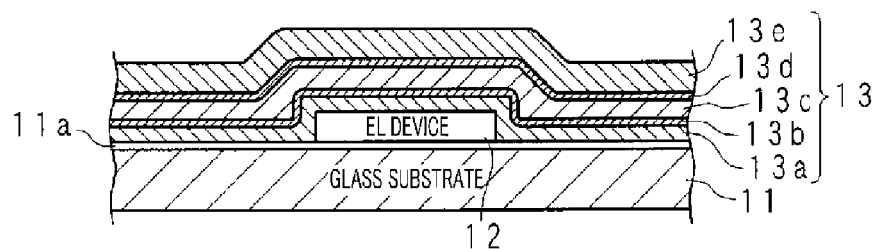
FIG. 1H is an explanatory diagram that conceptually illustrates an example of the sealing film forming method in accordance with the illustrative embodiment.

Thereafter, as depicted in FIG. 1H, a second inorganic layer 13e thicker than the first inorganic layer 13a is formed on the second amorphous carbon layer 13d. A forming method of the second inorganic layer 13e is the same as that of the first inorganic layer 13a. However, the second inorganic layer 13e is an outermost layer of a sealing film 13 and serves as a moisture permeability-resistant film, and, thus, it is formed to be thicker than the first inorganic layer 13a. By way of example, a thickness of the second inorganic layer 13e is in a range of from about 1.0 μm to about 3.0 μm. The hydrocarbon layer 13c under the second inorganic layer 13e has a flattened reflow shape and the defective part caused by the impurity particle disappears. Therefore, the second inorganic layer 13e can securely cover a surface of the hydrocarbon layer 13c.

Figure 2:
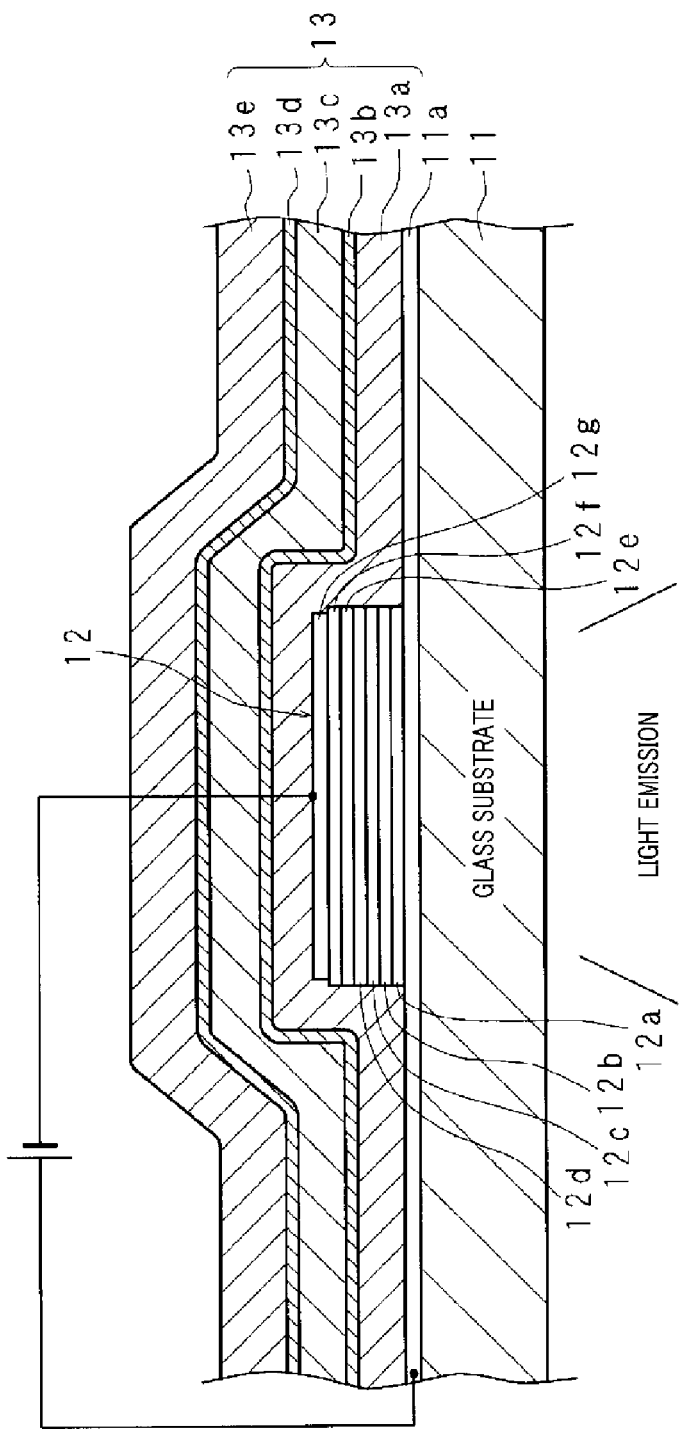
FIG. 2 is a side cross sectional view that illustrates an example of an EL device in accordance with the illustrative embodiment.

FIG. 2 is a side cross sectional view that illustrates an example of the EL device in accordance with the present illustrative embodiment. The EL device in accordance with the present illustrative embodiment has a stacked structure in which the anodic layer 11a, the light-emitting layer, and a cathodic layer 12g are stacked on a glass substrate 11. The sealing film 13 seals the whole layers.

The anodic layer 11a is a transparent electrode, for example, an ITO film, that can transmit light of the light-emitting layer.

The light-emitting layer has a six-layered structure formed by stacking first to sixth layers by performing, for example, the vacuum deposition method. A first layer is a hole injection layer 12a, a second layer is a hole transport layer 12b, a third layer is a blue light emitting layer 12c, a fourth layer is a red light emitting layer 12d, a fifth layer is a green light emitting layer 12e, and a sixth layer is an electron transport layer 12f. A configuration of the first to sixth layers described herein is just an example.

The cathodic layer 12g is formed of silver, aluminum, an aluminum alloy, a lithium aluminum alloy or an alloy of magnesium and silver by performing a vapor deposition method.

The EL device 12 formed on the glass substrate 11 is covered by the sealing film 13. The sealing film 13 includes the first inorganic layer 13a, the first amorphous carbon layer 13b, the reflow-shaped hydrocarbon layer 13c, the second amorphous carbon layer 13d, and the second inorganic layer 13e. The first inorganic layer 13a is formed on the surface of the EL device 12, the first amorphous carbon layer 13b is formed on the first inorganic layer 13a, the hydrocarbon layer 13c is formed on the first amorphous carbon layer 13b, the second amorphous carbon layer 13d is formed on the hydrocarbon layer 13c, and the second inorganic layer 13e is formed to be thicker than the first inorganic layer 13a on the second amorphous carbon layer 13d. The first and second inorganic layers 13a and 13e are formed of a silicon nitride film, a silicon oxide film or an aluminum oxide film. The hydrocarbon layer 13c is made of so-called paraffin. A thickness of the first inorganic layer 13a is in a range of from about 100 nm to about 1000 nm, a thickness of the hydrocarbon layer 13c is in a range of from about 0.5 μm to about 2.0 μm, a thickness of the second inorganic layer 13e is in a range of from about 1.0 μm to about 3.0 μm, and each thickness of the first and second amorphous carbon layers 13b and 13d is in a range of 100 nm to about 500 nm.

Figure 3:
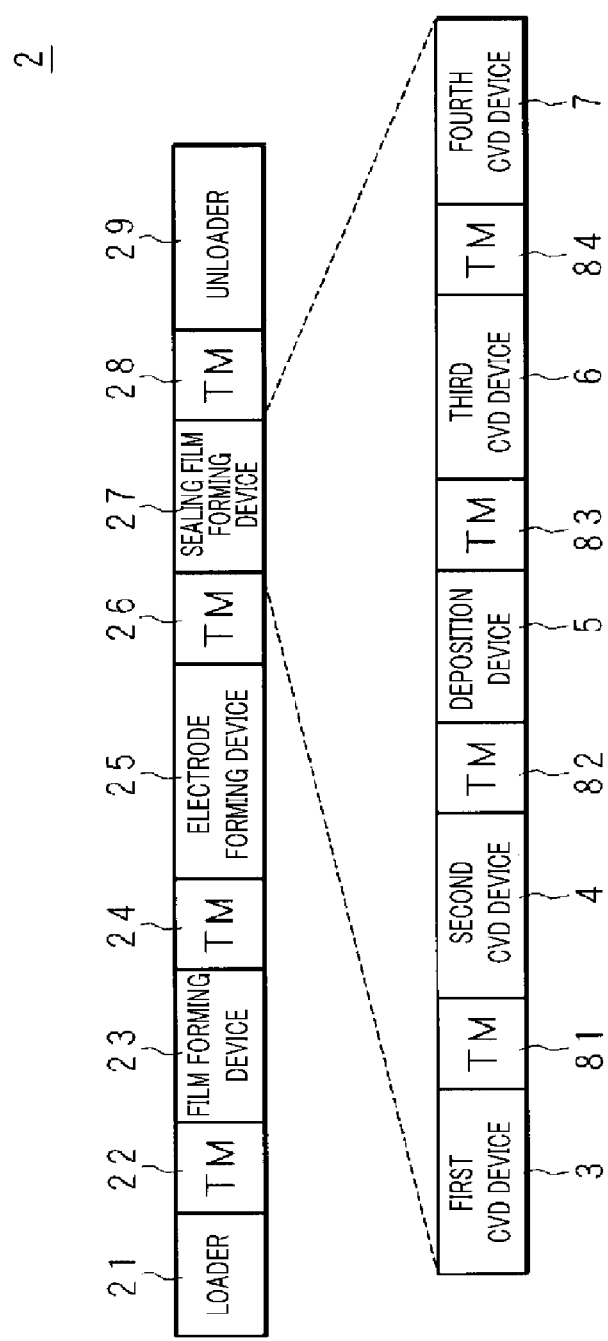
FIG. 3 is a block diagram that schematically illustrates a configuration example of the EL device manufacturing system.

FIG. 3 is a block diagram that schematically illustrates a configuration example of the EL device manufacturing system 2. The EL device manufacturing system in accordance with the present illustrative embodiment includes a loader 21, a transfer module (TM) 22, a film forming device 23, a transfer module (TM) 24, an electrode forming device 25, a transfer module (TM) 26, a sealing film forming device 27, a transfer module (TM) 28, and an unloader 29 arranged in series along a transfer direction of the glass substrate 11. Hereinafter, a transfer module (TM) will be referred to as a transfer module, and transfer modules in the drawings are denoted by TM for convenience of drawing.

The loader 21 is configured to load the glass substrate 11, for example, the glass substrate 11 on which the anodic layer 11a is previously formed, into the EL device manufacturing system 2. The transfer modules 22, 24, 26, and 28 are configured to deliver the glass substrate 11 between processing devices.

The film forming device 23 is configured to form the hole injection layer 12a, the hole transport layer 12b, the blue light emitting layer 12c, the red light emitting layer 12d, the green light emitting layer 12e, and the electron transport layer 12f on the glass substrate 11 by performing the vacuum deposition method.

The electrode forming device 25 is configured to form the cathodic layer 12g on the electron transport layer 12f by depositing, for example, silver, aluminum, an aluminum alloy, a lithium aluminum alloy or an alloy of magnesium and silver with a pattern mask.

The sealing film forming device 27 is configured to form the sealing film 13 by performing the CVD and vapor deposition, and to seal various films formed on the glass substrate 11.

The unloader 29 is configured to unload the glass substrate 11 from the EL device manufacturing system 2.

The sealing film forming device 27 includes a first CVD device 3, a transfer module 81, a second CVD device 4, a transfer module 82, a deposition device 5, a transfer module 83, a third CVD device 6, a transfer module 84, and a fourth CVD device 7 arranged in series along the transfer direction of the glass substrate 11. The first CVD device 3 is configured to form the first inorganic layer 13a on the surface of the EL device 12, the second CVD device 4 is configured to form the first amorphous carbon layer 13b on the first inorganic layer 13a, the deposition device 5 is configured to form and heat the hydrocarbon layer 13c and to irradiate electron beams or ultraviolet rays to the hydrocarbon layer 13c, the third CVD device 6 is configured to form the second amorphous carbon layer 13d on the hydrocarbon layer 13c, and the fourth CVD device 7 is configured to form the second inorganic layer 13e thicker than the first inorganic layer 13a on the second amorphous carbon layer 13d. Hereinafter, a configuration of each device will be explained.

Figure 4:
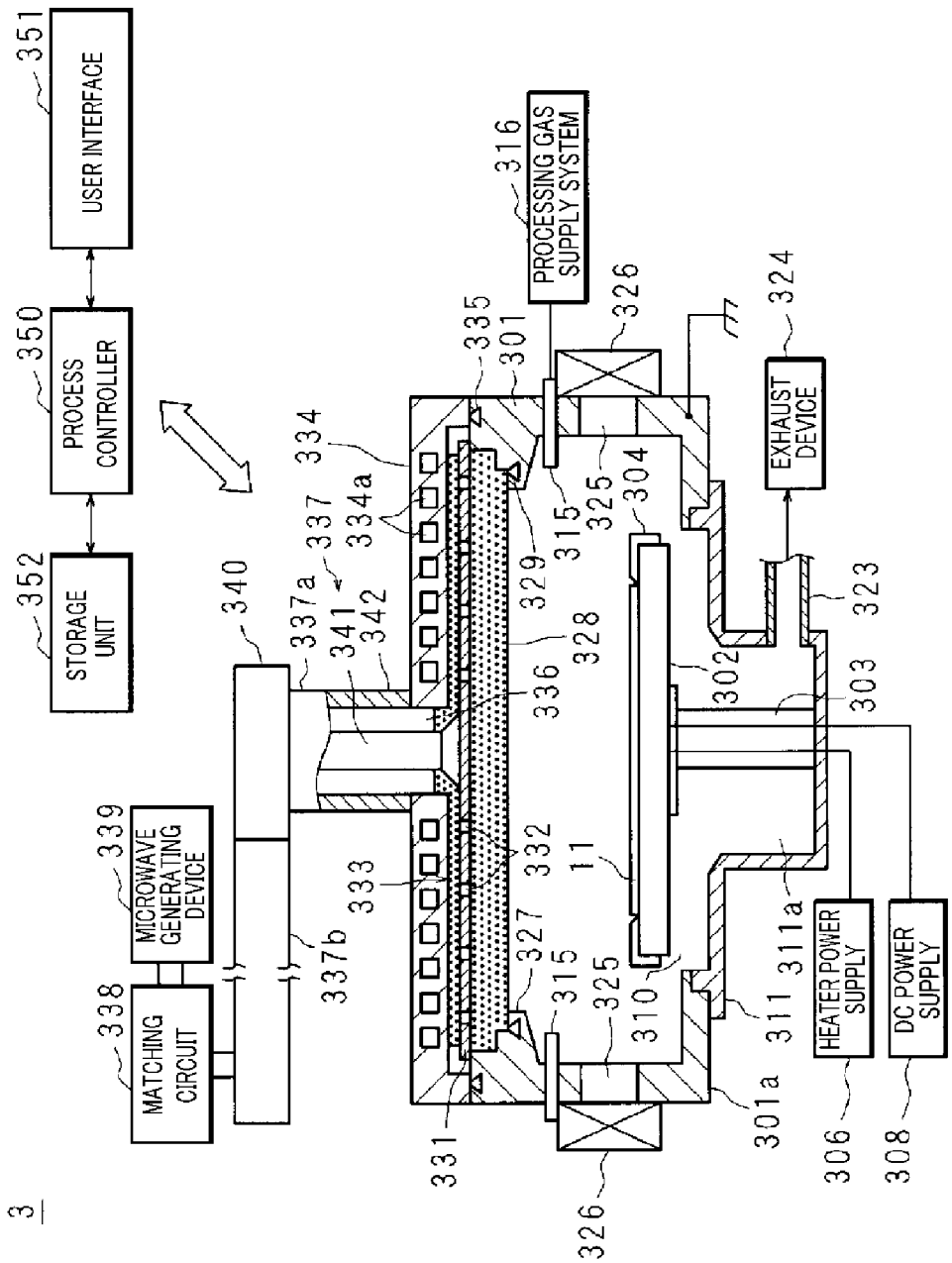
FIG. 4 is a side cross sectional view that schematically illustrates a configuration example of a first CVD device.

FIG. 4 is a side cross sectional view that schematically illustrates a configuration example of the first CVD device 3. The first CVD device 3 is, for example, a RLSA (Radial Line Slot Antenna) type, and includes a substantially cylindrical processing chamber 301. The processing chamber 301 is airtightly provided and grounded. The processing chamber 301 is made of, for example, aluminum and includes a flat circular ring-shaped bottom wall 301a having a circular opening 310 at a substantially central portion thereof and a side wall provided on the circumference of the bottom wall 301a. An upper portion of the processing chamber 301 is opened. Further, a cylindrical liner made of quartz may be provided at an inner periphery of the processing chamber 301.

At the side wall of the processing chamber 301, a gas inlet member 315 is annularly disposed. The gas inlet member 315 is connected to a processing gas supply system 316. The gas inlet member 315 is provided in, for example, a shower head shape. A certain processing gas is introduced into the processing chamber 301 through the gas inlet member 315 from the processing gas supply system 316. The processing gas is appropriately selected depending on a kind of a plasma process. By way of example, if a silicon nitride film is formed by performing the plasma CVD method, a monosilane ($SiH_4$) gas, an ammonia ($NH_3$) gas, and a nitrogen ($N_2$) gas may be used.

Further, transfer openings 325 configured to transfer the glass substrate 11 between the transfer modules 26 and 28 adjacent to the first CVD device 3 are provided at the side wall of the processing chamber 301. Further, gate valves 326 configured to open and close the transfer openings 325 are provided at the side wall of the processing chamber 301.

A cylindrical exhaust chamber 311 having a bottom protruding downwards is provided at the bottom wall 301a of the processing chamber 301 to communicate with the opening 310. At a side wall of the exhaust chamber 311, an exhaust pipe 323 is provided. The exhaust pipe 323 is connected to an exhaust device 324 including a high speed vacuum pump. By operating the exhaust device 324, a gas within the processing chamber 301 is uniformly discharged into a space 311a within the exhaust chamber 311, and exhausted through the exhaust pipe 323. Therefore, it is possible to depressurize the inside of the processing chamber 301 to a certain vacuum level, for example, about 0.133 Pa, at high speed.

At a central lower area of the exhaust chamber 311, a column-shaped member 303 made of ceramic such as AlN substantially vertically protrudes. A sample table 302 is provided at a front end of the column-shaped member 303. The glass substrate 11 on which a plasma process is performed is mounted on the sample table 302. A guide 304 configured to hold the glass substrate 11 is provided at an outer periphery of the sample table 302. The sample table 302 is connected to a heater power supply 306 configured to heat the glass substrate 11 and a DC power supply 308 for electrostatic attraction.

At an upper opening of the processing chamber 301, a ring-shaped supporting member 327 is provided along a periphery thereof. At the supporting member 327, a disk-shaped dielectric window 328, made of quartz and ceramic such as $Al_2O_3$, configured to transmit microwave is airtightly provided via a sealing member 329.

Above the dielectric window 328, a circular plate-shaped slot plate 331 is provided to face the sample table 302. The slot plate 331 is in surface contact with the dielectric window 328 and is engaged with an upper end of the side wall of the processing chamber 301. The slot plate 331 is made of a conductor such as a gold-plated copper or aluminum plate and includes multiple microwave radiation slots 332 formed in a certain pattern through the slot plate 331. That is, the slot plate 331 constitutes a RLSA antenna. The microwave radiation slots 332 are formed in, for example, long grooves and a pair of the microwave radiation slots 332 adjacent to each other are arranged closely to form a substantially L-shape. The multiple microwave radiation slots 332 are concentrically arranged in pairs. A length of each microwave radiation slot 332 or a distance between the microwave radiation slots 332 is determined depending on a wavelength of the microwave.

On an upper surface of the slot plate 331, a dielectric plate 333 having a higher permittivity than a vacuum is provided to be in surface contact with the upper surface of the slot plate 331. The dielectric plate 333 has a flat circular dielectric plate part. At a substantially central portion of the circular dielectric plate part, a hole is formed. A microwave incident part of a cylindrical shape is protruded from a periphery of the hole in a substantially vertical manner with respect to the circular dielectric plate part.

A disk-shaped shield cover body 334 is provided on an upper surface of the processing chamber 301 to cover the slot plate 331 and the dielectric plate 333. The shield cover body 334 is made of metal such as aluminum or stainless steel. A sealing member 335 is provided to seal a space between the upper surface of the processing chamber 301 and the shield cover body 334.

Within the shield cover body 334, coolant paths 334a are formed. While coolant flows through the coolant paths 334a, the slot plate 331, the dielectric window 328, the dielectric plate 333, and the shield cover body 334 are cooled. Further, the shield cover body 334 is grounded.

At a central portion of an upper wall of the shield cover body 334, an opening 336 is formed. The opening 336 is connected to a waveguide 337. The waveguide 337 includes a coaxial waveguide 337a having a circular cross-sectional shape and a rectangular waveguide 337b having a rectangular cross-sectional shape. The coaxial waveguide 337a is extended upwards from the opening 336. Further, the rectangular waveguide 337b is connected to an upper end of the coaxial waveguide 337a and extended in a horizontal direction. An end of the rectangular waveguide 337b is connected to a microwave generating device 339 via a matching circuit 338. Microwave having a frequency of, for example, about 2.45 GHz from the microwave generating device 339 is propagated through the waveguide 337 to the slot plate 331. A frequency of the microwave may be about 8.35 GHz, about 1.98 GHz, and about 915 MHz. At an end of a contact portion between the rectangular waveguide 337b and the coaxial waveguide 337a, a mode converter 340 is provided. The coaxial waveguide 337a includes a cylindrical outer conductive coaxial tube 342 and an inner conductive coaxial tube 341 provided along a center line of the outer conductive coaxial tube 342. A lower end of the inner conductive coaxial tube 341 is connected and fixed to a central portion of the slot plate 331. Further, the microwave incident part of the dielectric plate 333 is provided in the coaxial waveguide 337a.

The first CVD device 3 includes a process controller 350 that controls each component of the first CVD device 3. The process controller 350 is connected to a user interface 351 including a keyboard with which a process manager inputs commands to manage the first CVD device 3 and a display that visually displays an operation status of the first CVD device 3. Further, the process controller 350 is connected to a storage unit 352 that stores therein a process control program including a control program and processing condition data for implementing various processes performed by the first CVD device 3 under the control of the process controller 350. The process controller 350 retrieves a certain process control program from the storage unit 352 in response to an instruction from the user interface 351 and executes the program. A required process is performed by the first CVD device 3 under the control of the process controller 350.

The configuration of the first CVD device 3 has been explained. The second and third CVD devices 4 and 6 have the same configuration as the first CVD device 3 except that in the second and third CVD devices 4 and 6, a processing gas for forming an amorphous carbon layer is supplied from the processing gas supply system 316. If an amorphous carbon layer is formed, a hydrocarbon ($C_xH_y$) gas, an argon (Ar) gas, and the like are used. Herein, x and y are integers, and the hydrocarbon ($C_xH_y$) gas is, for example, a methane ($CH_4$) gas. The fourth CVD device 7 has the same configuration as the first CVD device 3.

Figure 5:
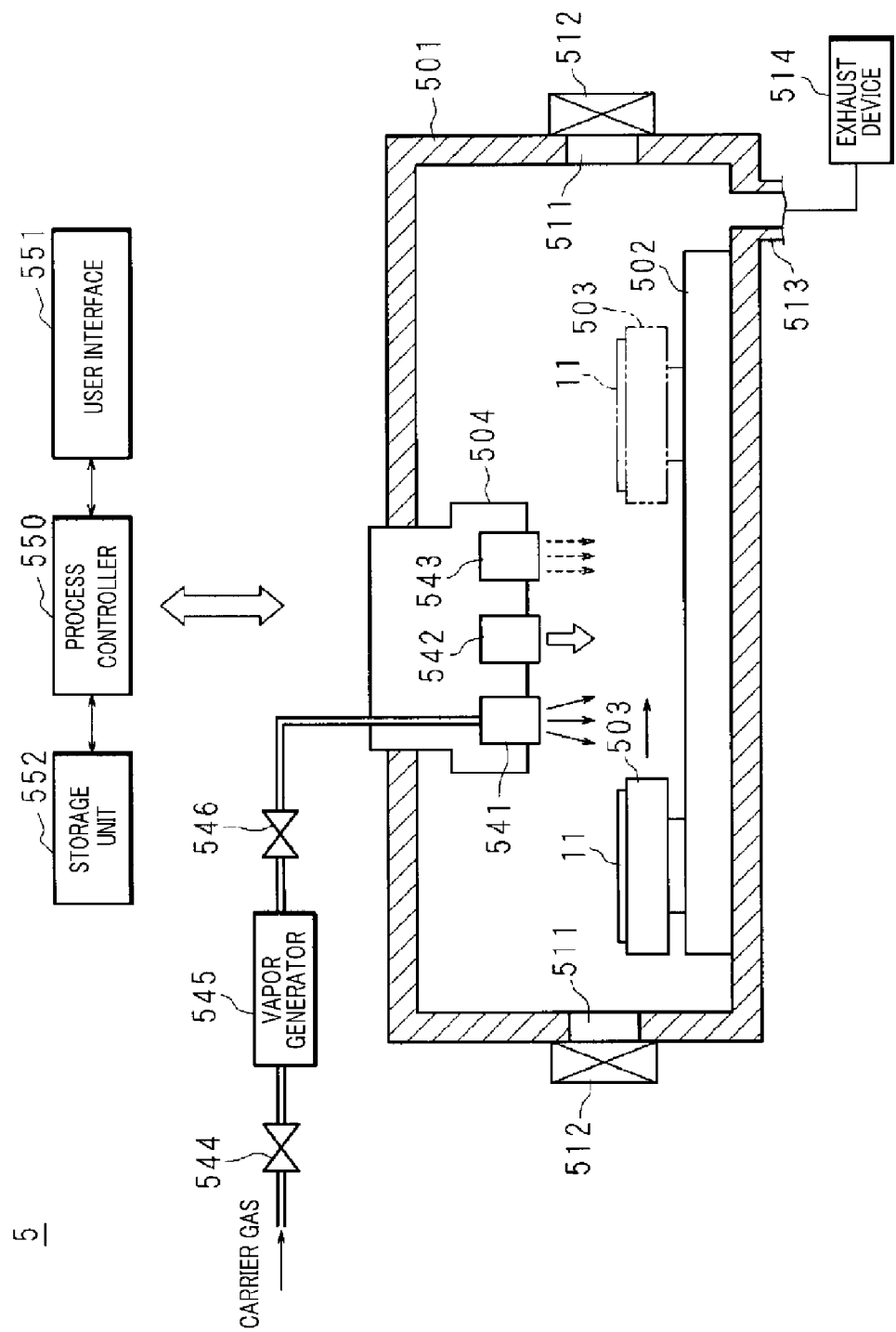
FIG. 5 is a side cross sectional view that schematically illustrates a configuration example of a deposition device.

FIG. 5 is a side cross sectional view that schematically illustrates a configuration example of the deposition device 5. The deposition device 5 includes a processing chamber 501 accommodating therein the glass substrate 11 and configured to perform a deposition process, a reflow process, and a curing process of the hydrocarbon layer 13c onto the glass substrate 11. The processing chamber 501 has a substantially rectangular hollow shape having a longitudinal direction in a transfer direction and is made of aluminum and stainless steel. Transfer openings 511 for loading and unloading the glass substrate 11 into and from the processing chamber 501 are provided at both end surfaces in the longitudinal direction of the processing chamber 501. The transfer openings 511 are opened and closed by gate valves 512, respectively. An exhaust pipe 513 is provided at a certain place of the processing chamber 501. The exhaust pipe 513 is connected to an exhaust device 514 including a high speed vacuum pump. By operating the exhaust device 514, it is possible to depressurize the inside of the processing chamber 501 to a certain pressure level, for example, from about $10^{-2}$ Pa.

A transfer device 502 configured to transfer the glass substrate 11 loaded into the processing chamber 501 is provided at a bottom portion of the processing chamber 501. The transfer device 502 includes a guide rail provided at the bottom portion of the processing chamber 501 in the longitudinal direction thereof and a moving member to be guided along the guide rail and moved in the transfer direction thereof, i.e., the longitudinal direction thereof. A supporting table 503 configured to support the glass substrate 11 in a substantially horizontal manner is provided at an upper end of the moving member. Within the supporting table 503, an electrostatic chuck for holding the glass substrate 11, a heater for controlling a temperature of the glass substrate 11 or heating the glass substrate 11, and a coolant pipe are provided. Further, the supporting table 503 is configured to be moved by operating a linear motor.

At a substantially central upper portion of the processing chamber 501 in the transfer direction thereof, a substrate processing head 504 is provided. The substrate processing head 504 includes a deposition head 541 configured to form the hydrocarbon layer 13c on the glass substrate 11 by performing the vacuum deposition method, an infrared ray irradiation head 542 configured to soften or melt the formed hydrocarbon layer 13c by irradiating infrared rays to the glass substrate 11, and a curing process head 543 configured to cure the hydrocarbon layer 13c by irradiating electron beams or ultraviolet rays to the glass substrate 11.

In the illustrative embodiment, there has been explained a device configured to perform all of a deposition process, a reflow process, and a curing process of the hydrocarbon layer 13c. However, a device for performing deposition of the hydrocarbon layer 13c, a device for performing a reflow process of the hydrocarbon layer 13c, and a device for performing a curing process of the hydrocarbon layer 13c may be provided separately.

The deposition head 541 is configured to discharge vapor of a hydrocarbon material supplied through a transfer pipe toward the glass substrate 11 accommodated in the processing chamber 501. The deposition head 541 is connected to a vapor generator 545 provided outside the processing chamber 501 via the transfer pipe. The vapor generator 545 includes a vessel made of, for example, stainless steel and a heating member provided within the vessel. The heating member includes a vessel accommodating a hydrocarbon material and heats the hydrocarbon material with electric power supplied from a power supply. The hydrocarbon material may include, for example, paraffin represented by a molecular formula of $C_xH_y$. The hydrocarbon material is heated by, for example, an electrical resistor embedded in the vessel. In this way, the hydrocarbon material in the heating member is heated to generate vapor of the hydrocarbon material. Further, the vessel is connected to a carrier gas supply pipe through which a carrier gas including an inert gas, e.g., a rare gas such as an argon (Ar) gas is supplied to the glass substrate 11. Together with the carrier gas supplied to the vessel through the carrier gas supply pipe, the vapor of the hydrocarbon material is supplied to the deposition head 541 from the vapor generator 545 through the transfer pipe. In the middle of the carrier gas supply pipe and the transfer pipe, flow rate control valves 544 and 546 configured to control a supply amount of the carrier gas are provided. The flow rate control valves 544 and 546 may include, for example, electromagnetic valves, and an opening/closing operation of the flow rate control valves 544 and 546 is controlled by a process controller 550 to be described later.

By way of example, the infrared ray irradiation head 542 includes an infrared ray lamp configured to irradiate infrared rays over substantially an entire surface of the hydrocarbon layer 13c formed on the glass substrate 11, i.e., an area where the sealing film 13 is to be formed, when the glass substrate 11 is transferred by the supporting table 503. Infrared rays irradiated from the infrared ray lamp may have intensity enough to soften or melt the hydrocarbon layer 13c formed on the glass substrate 11. More desirably, infrared rays may have intensity in which the EL device 12 is not deteriorated even if the infrared rays are continuously irradiated. The infrared ray lamp is connected to a power supply that supplies electric power. The supply of electric power is controlled by the process controller 550. The process controller 550 controls the supply of electric power to the infrared ray lamp so that the hydrocarbon layer 13c is heated to a temperature enough to soften or melt the hydrocarbon layer 13c but not to deteriorate the EL device 12.

The infrared ray irradiation head 542 is just an example of a device for heating the hydrocarbon layer 13c. By way of example, a hot plate configured to heat the hydrocarbon layer 13c may be provided in the supporting table 503 instead of the infrared ray irradiation head 542.

The curing process head 543 includes an electron gun configured to irradiate electron beams over substantially the entire surface of the hydrocarbon layer 13c formed on the glass substrate 11, i.e., an area where the sealing film is to be formed, when the glass substrate 11 is transferred by the supporting table 503. An operation of the electron gun is controlled by the process controller 550. If the hydrocarbon layer 13c is formed by using a UV curable hydrocarbon material, an ultraviolet ray lamp configured to irradiate ultraviolet rays to the glass substrate 11 is provided at the curing process head 543.

The deposition device 5 includes the process controller 550 that controls each component of the deposition device 5. The process controller 550 is connected to a user interface with which a process manager inputs commands to manage the deposition device 5. Further, the process controller 550 is connected to a storage unit 552 that stores therein a process control program including a control program and processing condition data for implementing various processes performed by the deposition device 5 under the control of the process controller 550. The process controller 550 retrieves a certain process control program from the storage unit 552 in response to an instruction from the user interface and executes the program. A required process is performed by the deposition device 5 under the control of the process controller 550.

Although there has been explained an example where the glass substrate 11 is transferred, the supporting table 503 may be fixed and the substrate processing head 504 may be moved with respect to the glass substrate 11.

Further, if the hydrocarbon layer 13c is formed by using a hydrocarbon material to be cured by electron beams, the curing process head 543 may not be provided in the deposition device 5. Since electron beams are irradiated during a process to be performed later for forming the second amorphous carbon layer 13d by performing the plasma CVD method, the hydrocarbon layer 13c can be cured while forming the second amorphous carbon layer 13d.

Hereinafter, referring to FIG. 3, operations of the EL device manufacturing system 2 and the sealing film forming device 27 having the above-described configuration will be explained briefly. Above all, the glass substrate on which the anodic layer 11a is previously formed is loaded into the film forming device 23 through the loader 21. In the film forming device 23, the EL device 12 is formed on the glass substrate 11. Then, the glass substrate 11 is loaded into the electrode forming device 25 by the transfer module 24 and the cathodic layer 12g is formed thereon. Thereafter, the glass substrate 11 is transferred to the first and second CVD devices 3 and 4, the deposition device 5, and the third and fourth CVD devices 6 and 7 in sequence by the transfer modules 26, 81, 82, 83, and 84. In the respective devices, the first inorganic layer 13a, the first amorphous carbon layer 13b, the hydrocarbon layer 13c, the second amorphous carbon layer 13d, and the second inorganic layer 13e are formed in sequence on the EL device 12, and the EL device 12 is sealed. Subsequently, the glass substrate 11 on which the EL device 12 is sealed is unloaded to the outside by the transfer module 28 through the unloader 29.

In accordance with the present illustrative embodiment, the sealing film 13 having high moisture permeability resistance can be formed in a shorter time and at lower cost compared to the conventional methods.

Further, if a sealing film is formed of a thick inorganic layer capable of burying impurity particles adhering to the surface of the glass substrate 11 through a low-temperature process, it may take several hours to form the sealing film. Even if the sealing film is formed of the thick inorganic layer capable of burying impurity particles adhering to the surface of the glass substrate 11, there may be some defective parts. Meanwhile, if a sealing film is formed of a single organic layer, contamination or a chemical reaction of the EL device 12 may be generated by an organic component of the sealing film so that moisture permeability resistance equal to that of an inorganic layer may not be obtained. However, as described in the present illustrative embodiment, the first inorganic layer 13a is formed on the EL device 12 and the hydrocarbon layer 13c is formed on the first inorganic layer 13a. As a result, it is possible to prevent the EL device 12 from be deteriorated. Further, the second inorganic layer 13e is formed on the hydrocarbon layer 13c having a flattened reflow shape with good coverage. As a result, it is possible to obtain good moisture permeability resistance.

Meanwhile, the first inorganic layer 13a having a certain thickness and the hydrocarbon layer 13c may constitute a sealing film without forming the second inorganic layer 13e. However, if the first inorganic layer 13a is too thin to bury the impurity particles adhering to the surface of the glass substrate 11, there may be a defective part and the defective part may be covered by the hydrocarbon layer 13c only. In this case, moisture may permeate through the defective part and the hydrocarbon layer 13c having lower moisture permeability resistance than an inorganic layer and may reach the EL device 12, so that the EL device 12 is deteriorated. In the present illustrative embodiment, the hydrocarbon layer 13c is additionally covered by the second inorganic layer 13e, it is possible to overcome the above-described problem regarding moisture permeability resistance.

Further, the hydrocarbon layer 13c is formed on the glass substrate 11 by performing the vacuum deposition method using a solid hydrocarbon material at room temperature. Accordingly, it is possible to suppress generation of impurity particles that contaminate the inside of the deposition device 5 and also possible to reduce defects of the EL device 12 as compared to a case where a liquid hydrocarbon material is used to form the hydrocarbon layer 13c.

Moreover, since the inorganic layers are formed by performing the plasma CVD method, it is possible to suppress generation of impurity particles and also possible to reduce defects of the EL device 12 as compared to a case where the inorganic layers are formed by sputtering.

Further, since the first and second amorphous carbon layers 13b and 13d are formed between the first and second inorganic layers 13a and 13e and the hydrocarbon layer 13c, respectively, moisture permeability resistance and adhesion between the first and second inorganic layers 13a and 13e and the hydrocarbon layer 13c can be increased.

In the illustrative embodiment, a hydrocarbon layer curing process and a second amorphous carbon layer forming process are performed in sequence. However, the hydrocarbon layer curing process and the second amorphous carbon layer forming process may be performed in parallel. That is, the hydrocarbon layer may be cured by using electrons in plasma generated when the second amorphous carbon layer is formed by performing the plasma CVD method.

Further, in the illustrative embodiment, the hydrocarbon layer is softened or melted by irradiating infrared rays. However, the hydrocarbon layer may be softened or melted by using a heating device, such as a heater, provided in a supporting table.

In the illustrative embodiment, the first and second inorganic layers are formed by using the same material. However, the first and second inorganic layers may be formed by using different materials from each other.

Moreover, in the illustrative embodiment, the sealing film having the five-layered structure, other layers may be additionally formed thereon. On the contrary, the EL device may be sealed with a sealing film without either or both of the first and second amorphous carbon layers.

First Modification Example

Figure 6:
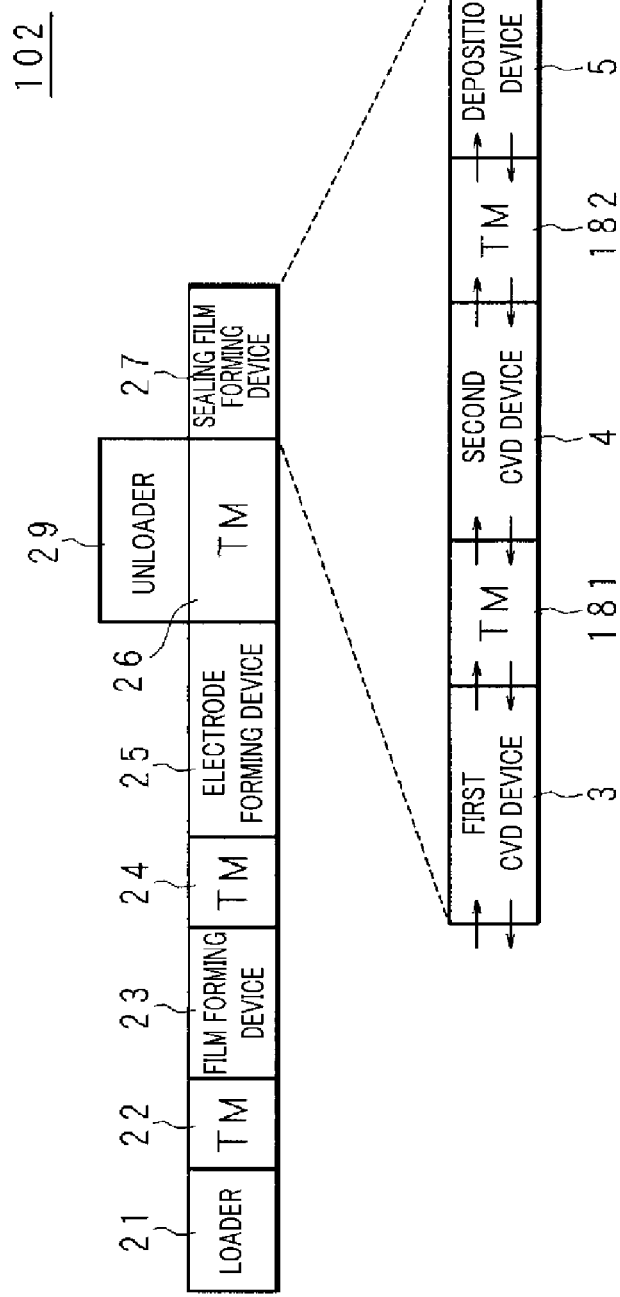
FIG. 6 is a block diagram that illustrates a configuration example of the EL device manufacturing system in accordance with a first modification example.

FIG. 6 is a block diagram that illustrates a configuration example of an EL device manufacturing system 102 in accordance with a first modification example. The EL device manufacturing system 102 of the first modification example includes the loader 21, the transfer module 22, the film forming device 23, the transfer module 24, the electrode forming device 25, the transfer module 26, the sealing film forming device 27, which are arranged in series along the transfer direction of the glass substrate 11. Further, the EL device manufacturing system 102 includes the unloader 29 branched from the transfer module 26.

The sealing film forming device 27 includes the first CVD device 3, a transfer module 181, the second CVD device 4, a transfer module 182, and the deposition device 5. The glass substrate 11 is transferred to move back and forth among the first CVD device 3, the second CVD device 4, and the deposition device 5. In the first modification example, the first CVD device 3 also serves as the fourth CVD device 7 described in the illustrative embodiment, and the second CVD device 4 also serves as the third CVD device 6.

An operation of the EL device manufacturing system 102 of the first modification example will be explained. A forming process of the cathodic layer 12g and a forming process of the hydrocarbon layer 13c having the reflow shape are performed in the same manner as the illustrative embodiment. The glass substrate 11 on which the hydrocarbon layer 13c having the reflow shape is formed is transferred again to the second CVD device 4 by the transfer module 182, and then, the second amorphous carbon layer 13d is formed on the hydrocarbon layer 13c therein. Subsequently, the glass substrate 11 on which the second amorphous carbon layer 13d is formed is transferred again to the first CVD device 3 by the transfer module 181. In the first CVD device 3, the second inorganic layer 13e is formed on the second amorphous carbon layer 13d, and then, unloaded by the transfer module 26 through the unloader 29.

In the first modification example, the sealing film in accordance with the present illustrative embodiment can be formed by the two CVD devices and the deposition device 5. Accordingly, scale of a device can be reduced. Further, it is possible to provide the EL device manufacturing system 102 at lower cost.

Further, in the present illustrative embodiment and the first modification example, the inorganic layer and the amorphous carbon layer are formed by different CVD devices. However, the inorganic layer and the amorphous carbon layer may be formed by a single CVD device by changing processing gases to be supplied.

Second Modification Example

Figure 7:
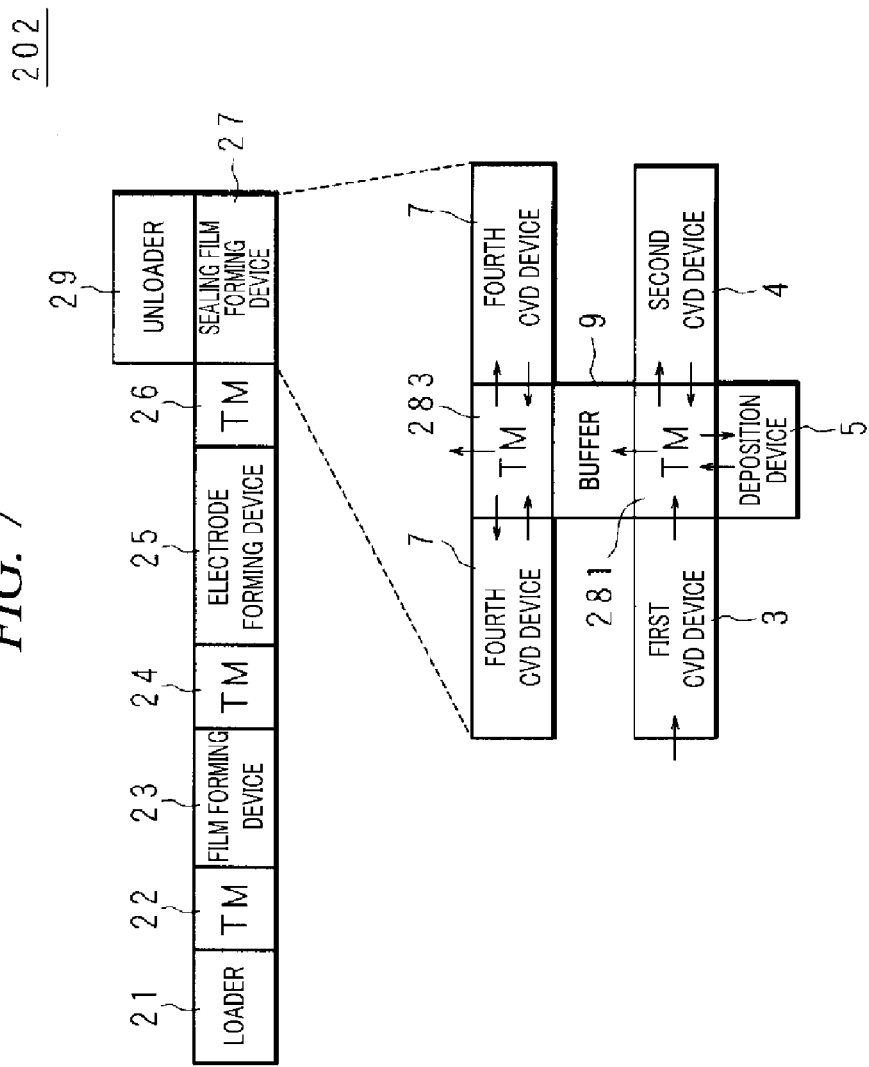
FIG. 7 is a block diagram that illustrates a configuration example of the EL device manufacturing system in accordance with a second modification example.

FIG. 7 is a block diagram that illustrates a configuration example of an EL device manufacturing system 202 in accordance with a second modification example. The EL device manufacturing system 202 of the second modification example includes the loader 21, the transfer module 22, the film forming device 23, the transfer module 24, the electrode forming device 25, the transfer module 26, the sealing film forming device 27, and the unloader 29, which are arranged in series along the transfer direction of a glass substrate 11.

The sealing film forming device 27 includes the first CVD device 3, a transfer module 281, and the second CVD device 4 arranged in series along the transfer direction of the glass substrate 11. The deposition device 5 is branched from the transfer module 281, and the transfer module 281 transfers the glass substrate 11 to move back and forth among the first CVD device 3, the second CVD device 4, and the deposition device 5. Further, a buffer 9 is provided at the transfer module 281 opposite to the deposition device 5. The buffer 9 temporarily stores therein the glass substrate 11 on which the second amorphous carbon layer 13d is formed. A transfer module 283 is provided at the buffer 9 opposite to the transfer module 281. The transfer module 283 is connected with the two fourth CVD devices 7 and the unloader 29. The transfer module 283 transfers the glass substrate 11 stored in the buffer 9 to a certain fourth CVD device 7 and unloads the glass substrate 11, on which the second inorganic layer 13e is formed, from the fourth CVD devices 7 through the unloader. Although the two fourth CVD devices 7 are provided in the second modification example, three or more CVD devices 7 may be provided.

An operation of the EL device manufacturing system 202 of the second modification example will be explained. The forming process of the cathodic layer 12g and the forming process of the first inorganic layer 13a and the first amorphous carbon layer 13b by using the first and second CVD devices 3 and 4 are performed in the same manner as the illustrative embodiment and the first modification example. The glass substrate 11 on which the first amorphous carbon layer 13b is formed is transferred from the second CVD device 4 to the deposition device 5 by the transfer module 281. Then, the hydrocarbon layer 13c having the reflow shape is formed by the deposition device 5. The glass substrate 11 on which the hydrocarbon layer 13c having the reflow shape is formed is transferred again to the second CVD device 4 by the transfer module 281. Then, the second amorphous carbon layer 13d is formed on the hydrocarbon layer 13c in the second CVD device 4. Thereafter, the glass substrate 11 on which the second amorphous carbon layer 13d is formed is transferred to the buffer 9 by the transfer module 281. Subsequently, the glass substrate 11 stored in the buffer 9 is transferred by the transfer module 283 to the fourth CVD device 7 which is empty. In the fourth CVD device 7, the second inorganic layer 13e is formed. The glass substrate 11 on which the second inorganic layer 13e is formed is unloaded by the transfer module 283 through the unloader 29.

The second inorganic layer 13e is thicker than the first inorganic layer 13a, and, thus, it takes some time to form the second inorganic layer 13e. In the second modification example, since the buffer 9 is provided and the two fourth CVD devices for forming the second inorganic layer 13e are provided, it is possible to form the sealing film 13 more quickly as compared to the first modification example.

Further, in the second modification example, the transfer module 281 is connected with the first and second CVD devices 3 and 4 and the deposition device 5. However, such a configuration is just an example. As described in the first modification example, the first CVD device 3, the second CVD device 4, and the deposition device 5 may be connected in series to each other via transfer modules.

Third Modification Example

Figure 8A:
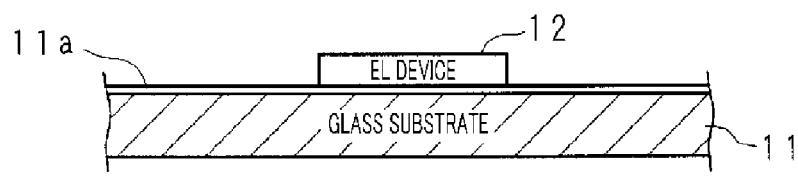
FIG. 8A is an explanatory diagram that conceptually illustrates an example of a sealing film forming method in accordance with a third modification example.
Figure 8B:
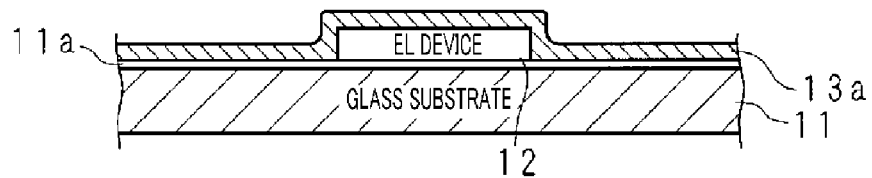
FIG. 8B is an explanatory diagram that conceptually illustrates an example of the sealing film forming method in accordance with the third modification example.

FIGS. 8A to 8F are explanatory diagrams each conceptually illustrating an example of a sealing film forming method in accordance with a third modification example. In the same manner as the illustrative embodiment, as depicted in FIG. 8A, the EL device 12 is formed on the glass substrate 11 on which the anodic layer 11a such as the ITO film is formed. Then, as depicted in FIG. 8B, the first inorganic layer 13a is formed on the surface of the glass substrate 11 on which the anodic layer 11a is formed and the surface of the EL device 12. A configuration and a forming method of the first inorganic layer 13a are the same as described in the illustrative embodiment.

Figure 8C:
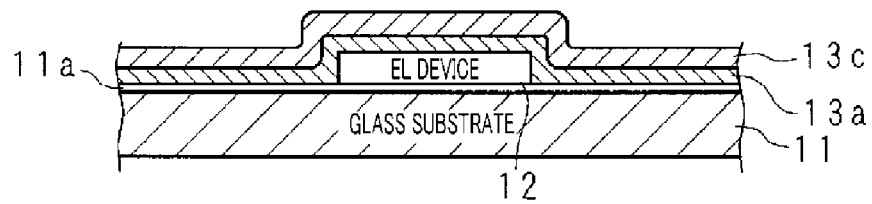
FIG. 8C is an explanatory diagram that conceptually illustrates an example of the sealing film forming method in accordance with the third modification example.

As depicted in FIG. 8C, the hydrocarbon layer 13c is formed on the first inorganic layer 13a formed on the EL device 12. A configuration and a forming method of the hydrocarbon layer 13c are the same as described in the illustrative embodiment.

Figure 8D:
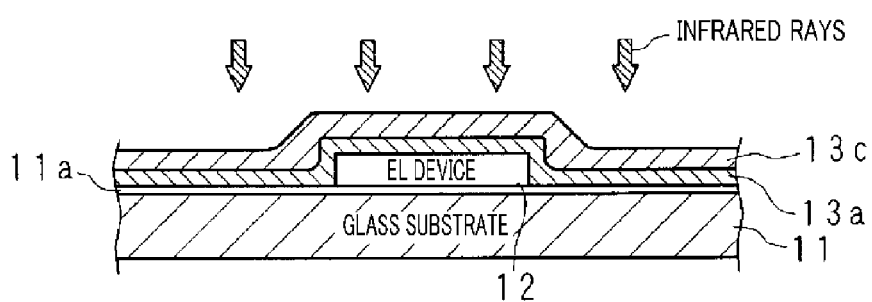
FIG. 8D is an explanatory diagram that conceptually illustrates an example of the sealing film forming method in accordance with the third modification example.
Figure 8E:
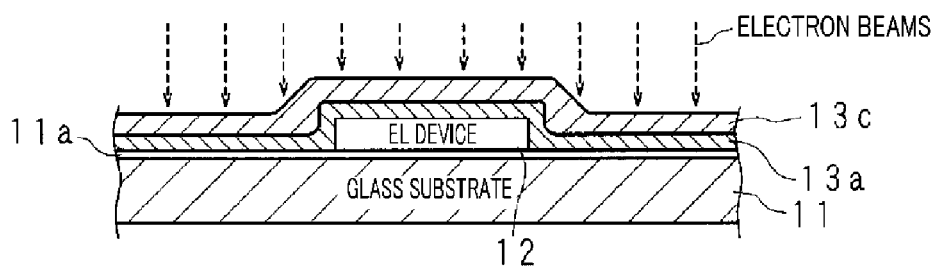
FIG. 8E is an explanatory diagram that conceptually illustrates an example of the sealing film forming method in accordance with the third modification example.

Then, as depicted in FIG. 8D, the hydrocarbon layer 13c is heated by irradiating infrared rays so that the hydrocarbon layer 13c is softened or melted. The hydrocarbon layer 13c is flattened by a reflow process. Thereafter, a temperature of the glass substrate 11 is decreased to, for example, the room temperature lower than a melting point of the hydrocarbon layer 13c. Then, as depicted in FIG. 8E, electron beams are irradiated and the hydrocarbon layer 13c is cured by a cross-linking reaction of a hydrocarbon material. The flattening process and the electron beams irradiation process may be performed appropriately onto the hydrocarbon layer 13c in parallel. Heating and cooling of the hydrocarbon layer and irradiation of electron beams may be performed technically the same as the illustrative embodiment.

Figure 8F:
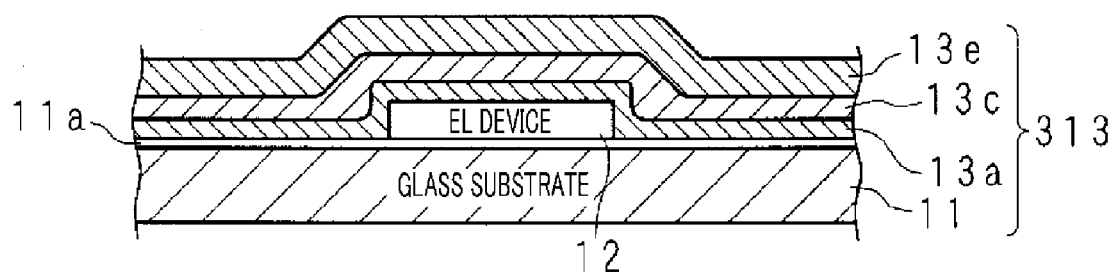
FIG. 8F is an explanatory diagram that conceptually illustrates an example of the sealing film forming method in accordance with the third modification example.

Then, as depicted in FIG. 8F, the second inorganic layer 13e thicker than the first inorganic layer 13a is formed on the hydrocarbon layer 13c. The second inorganic layer 13e is formed in the same manner as the first inorganic layer 13a. However, the second inorganic layer 13e is an outermost layer of a sealing film 313 and serves as a moisture permeability-resistant film. Accordingly, the second inorganic layer 13e is formed to be thicker than the first inorganic layer 13a.

Figure 9:
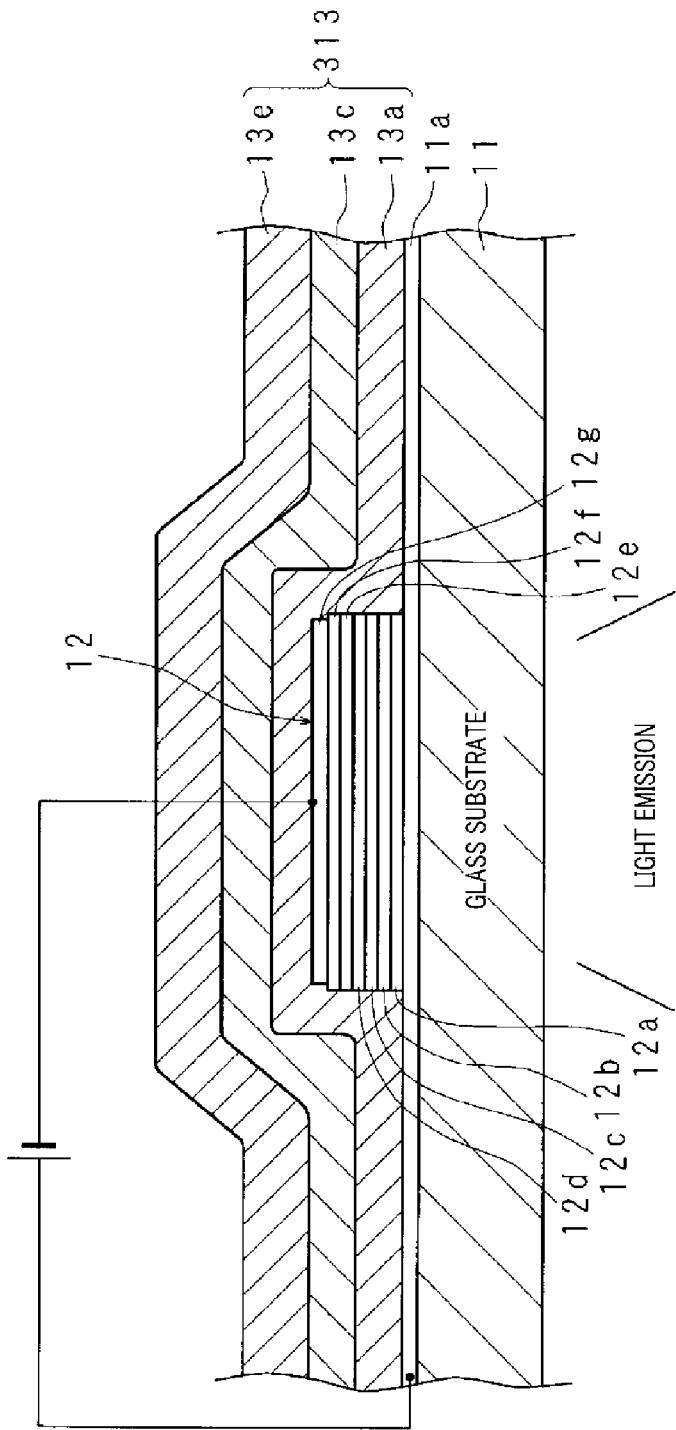
FIG. 9 is a side cross sectional view that illustrates an example of the EL device in accordance with the third modification example.

FIG. 9 is a side cross sectional view that illustrates an example of the EL device in accordance with the third modification example. The EL device in accordance with the third modification example has a stacked structure in which the anodic layer 11a, the light-emitting layer, and the cathodic layer 12g are formed on the glass substrate 11. The sealing film 313 seals the whole layers. Configurations of the anodic layer 11a and the light-emitting layer are the same as described in the illustrative embodiment. The EL device 12 formed on the glass substrate 11 is covered by the sealing film 313.

The sealing film 313 includes the first inorganic layer 13a formed on the surface of the EL device 12, the hydrocarbon layer 13c having the reflow shape on the first inorganic layer 13a, and the second inorganic layer 13e formed to be thicker than the first inorganic layer 13a on the hydrocarbon layer 13c. Configurations of the first and second inorganic layers 13a and 13e and the hydrocarbon layer 13c are the same as described in the illustrative embodiment.

In the third modification example, the sealing film 313 having the same effect as the illustrative embodiment and having high moisture permeability resistance can be formed in a shorter time and at lower cost.

Further, in the third modification example, since the first and second amorphous carbon layers 13b and 13d are not formed, it is possible to form the sealing film 313 in a shorter time.

In the third modification example, the sealing film 313 without both of the first and second amorphous carbon layers 13b and 13d and the forming method of the sealing film 313 have been explained. However, either of the first amorphous carbon layer 13b and the second amorphous carbon layer 13d may be formed in addition to the first and second inorganic layers 13a and 13e and the hydrocarbon layer 13c.

By way of example, since the hydrocarbon layer 13c has the reflow shape with good coverage, the second amorphous carbon layer 13d formed on the hydrocarbon layer 13c may be omitted, and the first amorphous carbon layer 13b may be formed. In this case, the sealing film 313 having high moisture permeability resistance can be formed in a shorter time.

The illustrative embodiment described herein is just an example and does not limit the present invention. The scope of the present invention is defined by the following claims rather than by the detailed description of the illustrative embodiment. It shall be understood that all modifications and embodiments conceived from the meaning and scope of the claims and their equivalents are included in the scope of the present invention.

What is claimed is:

1. A light-emitting device sealed by a sealing film, wherein the sealing film includes:
    a first inorganic layer formed on a surface of the light-emitting device;
    a hydrocarbon layer, having a reflow shape, formed on the first inorganic layer; and
    a second inorganic layer formed on the hydrocarbon layer, and
    the second inorganic layer is thicker than the first inorganic layer.

2. A sealing film forming method for forming a sealing film that seals a light-emitting device, the sealing film forming method comprising:
    forming a first inorganic layer on a surface of the light-emitting device;
    forming a hydrocarbon layer on the first inorganic layer;
    flattening the hydrocarbon layer by softening or melting the hydrocarbon layer;
    curing the hydrocarbon layer; and
    forming a second inorganic layer thicker than the first inorganic layer on the hydrocarbon layer after curing the hydrocarbon layer.

3. The sealing film forming method of claim 2, wherein an amorphous carbon layer is formed on the first inorganic layer after forming the first inorganic layer and before forming the hydrocarbon layer.

4. The sealing film forming method of claim 2, wherein an amorphous carbon layer is formed on the hydrocarbon layer after curing the hydrocarbon layer and before forming the second inorganic layer, or in parallel with curing the hydrocarbon layer.

5. The sealing film forming method of claim 2, wherein at least one of the first inorganic layer and the second inorganic layer is formed of a silicon nitride film, a silicon oxide film or an aluminum oxide film.

6. The sealing film forming method of claim 2, wherein the first inorganic layer and the second inorganic layer are formed by performing a plasma CVD.

7. The sealing film forming method of claim 2, wherein the hydrocarbon layer is formed by performing a deposition process, and
    the hydrocarbon layer is cured by irradiating electron beams or ultraviolet rays.

8. A sealing film forming device for forming a sealing film that seals a light-emitting device, the sealing film forming device comprising:
    a first inorganic layer forming device configured to form a first inorganic layer on a surface of the light-emitting device;
    a hydrocarbon layer forming device configured to form a hydrocarbon layer on the first inorganic layer;
    a heating device configured to heat the hydrocarbon layer;
    an irradiating device configured to irradiate electron beams or ultraviolet rays to the hydrocarbon layer; and
    a second inorganic layer forming device configured to form a second inorganic layer thicker than the first inorganic layer on the hydrocarbon layer after irradiating the electron beams or the ultraviolet rays to the hydrocarbon layer.

* * * * *